United States Patent [19]
Gottsche et al.

[11] Patent Number: 5,255,428
[45] Date of Patent: Oct. 26, 1993

[54] ELECTROOPTIC POLYMER VOLTAGE SENSOR AND METHOD OF MANUFACTURE THEREOF

[75] Inventors: Allan Gottsche, Lynge, Denmark; Joseph W. Perry, Pasadena, Calif.

[73] Assignee: California Institute of Technology, Pasadena, Calif.

[21] Appl. No.: 680,651

[22] Filed: Apr. 3, 1991

[51] Int. Cl.$^5$ ............... H01B 19/00; G02F 1/00
[52] U.S. Cl. ............... 29/631.1; 252/299.1; 252/585; 359/240; 359/246
[58] Field of Search ............... 252/282, 283, 299.1, 252/585, 586; 359/240, 246, 245, 244; 29/631.1

[56] References Cited

U.S. PATENT DOCUMENTS

| | | | |
|---|---|---|---|
| 4,428,873 | 1/1984 | Murayama et al. | 359/246 X |
| 4,859,576 | 8/1989 | Dirk et al. | 359/245 |
| 4,865,430 | 9/1989 | De Martino et al. | 359/240 |
| 5,026,147 | 6/1991 | Seane et al. | 252/585 X |

FOREIGN PATENT DOCUMENTS

| | | |
|---|---|---|
| 232138 | 8/1987 | European Pat. Off. |
| 257942 | 7/1988 | Fed. Rep. of Germany |
| WO88/02131 | 3/1988 | PCT Int'l Appl. |

OTHER PUBLICATIONS

"Poled Polymeric Second Harmonic Generation Materials, Chemical Manipulation of the Temporal Characteristics of Electric Field-Induced Noncentrosymmetry" by M. A. Hubbard, N. Minami, C. Ye, T. J. Marks, J. Yang and G. K. Wong, SPIE vol. 971 (1988), pp. 136-143.

"In Situ Measurements of Corona Poling Induced SHG in Amorphous Polymers" by Manfred Eich, Ayusman Sen, Herbert Looser, Do Y. Yoon, Gary C. Bjorklund, Robert Twieg and Jerome D. Swalen, SPIE vol. 971 (1988), pp. 128-135.

"Fiber-Optic Sensing of Voltages by Line Integration of the Electric Field" by K. Bohnert and J. Nehring, Optics Letters, vol. 14, No. 5 (Mar. 1, 1989), pp. 290-292.

"Electro-Optic Phase Modulation and Optical Second-harmonic Generation in Corona-Poled Polymer Films" by K. D. Singer, M. G. Kuzyk, W. R. Holland, J. E. Sohn, S. J. Lalama, R. B. Commizzoli, H. E. Katz and M. L. Schilling, Appl. Phys. Lett. 53 (19), (Nov. 7, 1988), pp. 1800-1802.

"Second Harmonic Generation in Poled Polymer Films" by K. D. Singer, J. E. Sohn and S. J. Lalama, Appl. Phys. Lett. 49 (5), (Aug. 4, 1986), pp. 248-250.

"Novel Second-Order Nonlinear Optical Polymers Via Chemical Cross-Linking-Induced Vitrification Under Electric Field" by Manfred Eich, Bernd Reck, Do Y. Yoon, C. Grant Wilson and Gary C. Bjorklund, J. Appl. Phys. 66 (7), (Oct. 1, 1989), pp. 3241-3247.

*Primary Examiner*—Carl J. Arbes
*Attorney, Agent, or Firm*—Leonard Tachner

[57] ABSTRACT

An optical voltage sensor utilizing an electrooptic polymer is disclosed for application to electric power distribution systems. The sensor, which can be manufactured at low cost in accordance with a disclosed method, measures voltages across a greater range than prior art sensors. The electrooptic polymer, which replaces the optical crystal used in prior art sensors, is sandwiched directly between two high voltage electrodes. Voltage is measured by fiber optical means, and no voltage division is required. The sample of electrooptic polymer is fabricated in a special mold and later mounted in a sensor housing. Alternatively, mold and sensor housing may be identical. The sensor housing is made out of a machinable polymeric material and is equipped with two opposing optical windows. The optical windows are mounted in the bottom of machined holes in the wall of the mold. These holes provide for mounting of the polarizing optical components and for mounting of the fiber optic connectors. One connecting fiber is equipped with a light emitting diode as a light source. Another connecting fiber is equipped with a photodiode as a detector.

9 Claims, 6 Drawing Sheets

ELECTROOPTIC POLYMER VOLTAGE SENSOR AND METHOD OF MANUFACTURE THEREOF

ORIGIN OF INVENTION

The invention described herein was made in the performance of work under a NASA contract, and is subject to the provisions of Public Law 96-517 (35 USC 202) in which the Contractor has elected to retain title.

TECHNICAL FIELD

This invention relates generally to electric power distribution and more specifically to a high voltage sensor to monitor energy flow in electric power distribution systems.

BACKGROUND ART

Future energy and capacity shortages will likely lead to reductions in energy consumption and increased cost. This, in turn, will demand a more efficient electric power distribution system than presently exists. In order to maximize efficiency, voltage and current sensors are necessary to determine the energy flow. For this application fiber optic sensors could be ideal because of their dielectric properties.

The electric power system can be divided into three subsystems:
1. The generation system, made up of plants where electricity is generated.
2. The transmission system, consisting of the power lines, transmitting power from the generating plants, often over long distances, to the areas where it is used.
3. The distribution system, carrying power from the transmission system to the individual consumers.

Within the distribution system, several voltages often exist. System voltages differ from country to country. Line voltage is defined as the voltage between the phase conductor and ground. The voltage reaching the ordinary consumer is relatively low (110 V in the U.S.A. and Canada, 220 V in much of Europe). However, these voltages are too low for distribution over more than a very short distance, given expected losses in that system. As a result, one or more intermediate voltage levels exist in the distribution system between transmission voltage and the low voltage which reaches consumers. These intermediate voltage levels are typically in the range of 10–20 kV, but values above and below this are also common.

Measured in terms of miles or kilometers of electrical wire, the distribution system is the largest part of the electric power system. It is therefore also the part where the greatest loss exists and where the largest amount of money can be saved if the operation of the system is optimized.

The distribution system is very branched. Often the direction of power transmission can be changed by altering the way the branching is done. Load distribution determines the optimal way of operating the system. If the distribution of loads was known all the time, the system could be operated more economically.

Unfortunately, the distribution system is today the part of the electric power system from which the least data is being recorded. Current and voltage are only monitored at a few locations in the system. If currents and voltages were monitored more widely, breakers could be installed which, under remote control, could change the way the system was branched. Voltages could be remotely controlled by regulating the transformer ratios. The whole system could be operated in a much more cost efficient way. Also, if a fault occurred, it could easily be located and the faulty part isolated, so that the rest of the system could maintain normal operation. This concept is called distribution automation.

A distribution automation system depends on a large number of sensors to measure voltage, current or other information at individual nodes in the distribution power grid. A communication network is also necessary to collect data from the sensors and transmit data to the actuators. The network could be operated from a central computer, or the intelligence could be partially distributed, with most of the control done locally and only the data representing the status of the system sent to a central place for monitoring.

Fiber optic sensors have a number of inherent advantages in high voltage systems. It is more correct to talk about a fiber optic sensing system than a fiber optic sensor. Fiber optic measurement systems can be made in several different ways, but generally can be described as follows: The measuring system consists of a light source, which launches optical power into the transmitter fiber. The transmitter fiber transmits the optical power to the sensor head where interaction between the light and the measured quantity takes place. From the sensor head, the light is launched into the receiver fiber, which returns the signal to the optical detector.

Electrooptic polymer, used as the interaction material in such sensors, can be produced in bulk form and in large quantities at low cost. However, natural electrooptic crystals will remain costly as crystal growth, location of the crystal axes and polishing are all very complicated tasks. The cost of optical fibers has become quite low, as have costs for LEDs and PIN photo diodes for fiber optic use. Driver electronics, which are mostly operational amplifiers and standard electronic components are typically low cost products. Traditional optical polarization components are expensive. However, for wavelengths in the visible range, it is possible to buy extremely low cost polarizers and ¼ wave plates made of polymer. Many different types and qualities of polarizers and wave plates exist, over a wide price range. If electrooptic polymer could be made transparent in the visible wavelength range, the cost of optical polarization components could come down significantly. In recent years, new polarizers and wave plates have come on the market for the wavelength 820 nm. These new products seem to be of good quality, yet are reasonably priced. As demand for these components increases, prices should drop even further. Sensor accuracy depends very much on the optical polarization components, and stringent accuracy requirements may keep the prices of these components high.

Traditional voltage transformers and voltage dividers are very expensive when designed for high voltage levels. The high price is mostly due to high demands on the electrical insulation system at higher voltage levels. In the case of the fiber optic voltage sensor based on an electrooptic polymer, the electrical insulation between the high voltage and the electronics which monitors the signal, is less of a problem because optical fiber is a natural insulator.

A sensor designed to be installed with one electrode attached to ground and the other to high voltage potential would, of course, have to be designed to withstand a voltage higher than the peak phase voltage. However, as the sensor is sensitive to electric fields, it might be possible to operate it without direct electrical contact to ground. If the sensor is mounted between the phase conductor and a surrounding cylinder at a floating potential, the measurement would become sensitive to changes in ambient electric fields. This will probably not be a problem if high accuracy is not a demand. In addition, the demand on the insulation properties of the sensor would be much lower and the consequences of a sensor breaking down would be much less severe. Clearly, fiber optic voltage sensors of this kind, based on an electrooptic polymer, can be produced at low enough cost to be feasible for distribution automation.

The most relevant prior art known to the applicants is the disclosure in published PCT Application WO88/02131 to P. S. Ramanujam published 24 Mar. 1988 and entitled "A PROCESS FOR PRODUCING AN ELECTROOPTICAL MATERIAL HAVING CONTROLLABLE PROPERTIES, AND USE OF THE MATERIAL IN ELECTROOPTICAL COMPONENTS". The principal distinctions between the present invention and the Ramanujam disclosure are the application of an electric field in direct contact with the epoxy resin during the poling step herein and the use in the invention of electric current as a process control parameter to obtain the maximum electric poling field short of dielectric breakdown in the cured epoxy. Further Ramanujam does not disclose a voltage sensor of the precise configuration described herein. These and other distinctions make the invention disclosed and claimed herein patentably unique over Ramanujam. Other relevant prior art includes an article by M. A. Hubbard et al, appearing at pages 136-143, SPIE Vol. 971 (1988) and an article by Manfred Eich et al, appearing at pages 128-135 of the same publication. Both of these articles discuss the nonlinear optical properties of dye/crosslinked polymer systems. Other articles of relevance include:

1. K. Bohnert et al, pages 290-292, Optics Letters, Vol. 14, No. 5 (Mar. 1, 1989);
2. K. D. Singer et al, pages 1800-1802, Appl. Phys. Lett. 53 (19), (Nov. 7, 1988);
3. K. D. Singer et al, pages 248-250, Appl. Phys. Lett. 49 (5), (Aug. 4, 1986);
4. Manfred Eich et al, pages 3241-3247, J. Appl. Phys. 66 (7), (Oct. 1, 1989).

SUMMARY OF THE INVENTION

The optical components in the head of a voltage sensor based on electrooptic polymer could be made as small as a hazelnut. Even surrounded by an electrical insulating system, it could be fairly small. The electronics, light source and detector could be located on a standard, rack-mounted printed circuit board.

The sensor does not contain any mechanical or electronic parts which are subject to wear. The resistivity of the electrooptic epoxy is so high that virtually no current is able to flow and the amount of optical power absorbed by the polymer is relatively low. This means that almost no heat is generated in the system. As a result, the sensor can be expected to be very reliable if the material does not change with age, temperature or exposure to high electric fields. Light sources such as LEDs have a finite lifetime. However, the light source does not have to be turned on all the time; only when the sensor is interrogated. Because the LED is not at high voltage potential, it can easily be changed in routine maintenance.

The electric driver circuit for the sensor would typically be operated with operational amplifiers. The output from these can easily be converted to digital form by an A/D converter and be transmitted via a digital communication system.

The optical fibers are inherently immune to EMI. The driver electronics can be mounted in an electrically shielded box, which can create an electrically low noise environment for sensitive components.

In sensors based on the linear electrooptic effect, also known as Pockels effect, a phase delay from an electrooptic phase retarder is modulated onto the amount of optical power transmitted through the sensor.

An electrooptic phase retarder introduces an optical phase delay which is a linear function of the applied electric field. For an ideal device, the phase delay would be zero with no electric field applied, and directly proportional to the field when a field is applied. In practice, a certain amount of intrinsic birefringence will often be present. This means that the phase delay originating from the electric field will be superposed on a finite amount of constant phase delay. The phase delay thus is still a linear function of the electric field. For analysis, the component can be treated as an ideal electrooptic phase retarder followed by a regular phase retarder providing the constant phase delay. It may be necessary to compensate for undesired intrinsic birefringence by using not a ¼ wave plate, but a wave plate that has a phase delay which superposed on the intrinsic birefringence, will add up to a ¼ wave phase delay.

The electrooptic phase retarder can be implemented with electrooptic crystals or electrooptic polymer. In the case of electrooptic crystals the crystal axes have to be aligned correctly relative to the electric field, the propagation direction of the optical wave and the axes of polarizers and wave plates. In the case of the electrooptic polymer, it is the alignment of the poling axis which is important. The present invention deals with electrooptic polymer sensors and their fabrication in bulk form.

OBJECTS OF THE INVENTION

It is therefore a principal object of the present invention to provide a fiber optic high voltage sensor using an electrooptic polymer.

It is another object of the present invention to provide an electrooptic polymer voltage sensor for use in measuring voltage levels in the range of 10 kV to 20 kV in electric power distribution systems.

It is still an additional object of the present invention to provide a novel method for fabricating an electrooptic polymer in bulk form and then applying such to fabricating a high voltage sensor that is particularly useful in electrical power distribution.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the accompanying drawings in which.

DESCRIPTION OF A PREFERRED EMBODIMENT

Figure 1:
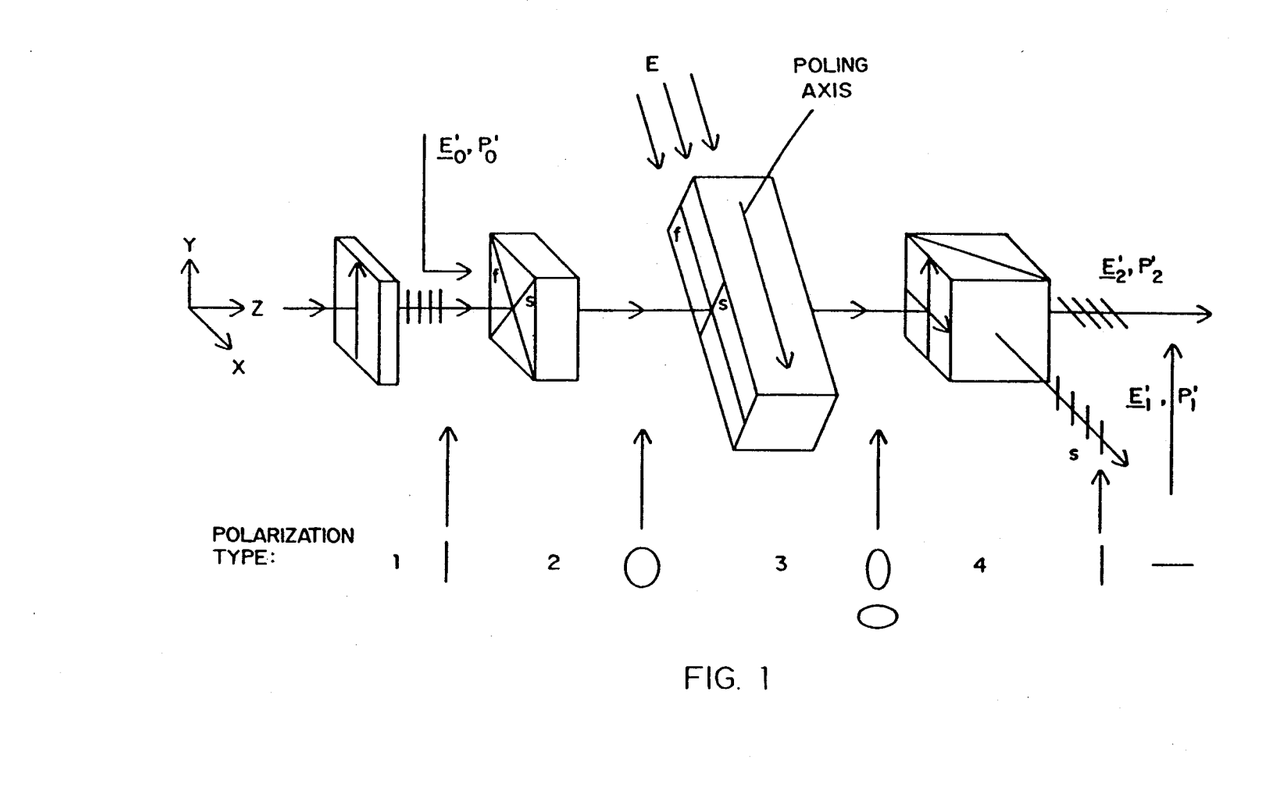
FIG. 1 is a schematic illustration of the optical polarization components of an electrooptic voltage sensor.

The electrooptic high voltage sensor described herein is often referred to in the literature as a Pockels cell. However the configuration is, from an optical point of view, identical to what is known as a transverse electrooptic amplitude modulator. The only difference is that, in the case of a sensor, the voltage represents the unknown parameter to be measured, while in the case of a modulator, the modulation voltage is known. An optical schematic representation of the high voltage sensor is seen in FIG. 1.

Furthest left are shown the principal axes of the chosen coordinate system. A wave of unpolarized light represented by an arrow, is launched into the system from the left towards the right.

(1) represents a linear polarizer, here called the polarizer.

(2) represents a ¼ waveplate.

(3) represents a transversely modulated electrooptic retarder, here called the electrooptic retarder.

(4) represents a polarizing beamsplitter used as an analyzer.

The unpolarized light wave is converted into a vertically linearly polarized wave by the polarizer. The vertically polarized wave now enters the ¼ wave plate, which separates the wave into two linearly polarized wave components of equal amplitude. One of the two wave components is parallel to the fast axis, which is denoted "f" in FIG. 1. The other wave component is parallel to the slow axis, which is denoted "s". Because of the difference in propagation speed of the two wave components, a phase delay of ¼ wave occurs. The phase delay makes the transmitted beam circularly polarized. After having passed the ¼ wave plate, the now circularly polarized light wave enters the electrooptic retarder. The electrooptic retarder is assumed to be ideal, that is to say it does not possess any intrinsic birefringence.

The electrooptic retarder is modulated with the electric field denoted E in FIG. 1. As the purpose of the sensor is to measure the line voltage on the 10 to 20 kV electric power distribution system, the electric field is assumed to be a 60-Hz ac signal. A phase retardation with a waveform identical to the waveform of the modulation field (i.e. the E field) is induced in the electrooptic retarder. If the waveform of the modulation field is a sinusoidal function of time, the waveform of the phase delay as a function of time will also be sinusoidal. As the phase delay changes from its negative peak value through zero to its positive peak value, it will modulate the ellipticity of the polarization of the transmitted light wave. When the induced phase delay is zero, the light remains circularly polarized. When the phase delay reaches its peak values, the polarization state of the light will be elliptical. The ellipticity of the two elliptical states will be the same from a geometric point of view. However, in one state the major axis of the ellipse will be vertical and in the other it will be horizontal. The transmitted wave will alternate around a circularly polarized state between two elliptically polarized states, one of them being represented by a tall and slim ellipse and the other by a short and fat ellipse.

After having passed the electrooptic retarder, the alternating wave enters the analyzer. The analyzer is placed so that its polarization axes are parallel to the two axes of deformation of the ellipse corresponding to the elliptically polarized light. A polarizing beam splitter has been chosen solely to demonstrate that there are two angles with which the analyzer can be aligned.

The alternation of the elliptically polarized light modulates the optical power of the two, orthogonally transmitted, linearly polarized light waves. In this way the waveform of the modulating electric field is superposed as a modulation on top of the transmitted optical power. However, one of the two signals transmitted by the polarizing beamsplitter is in phase with the modulation field and the other is out of phase.

Figure 2:
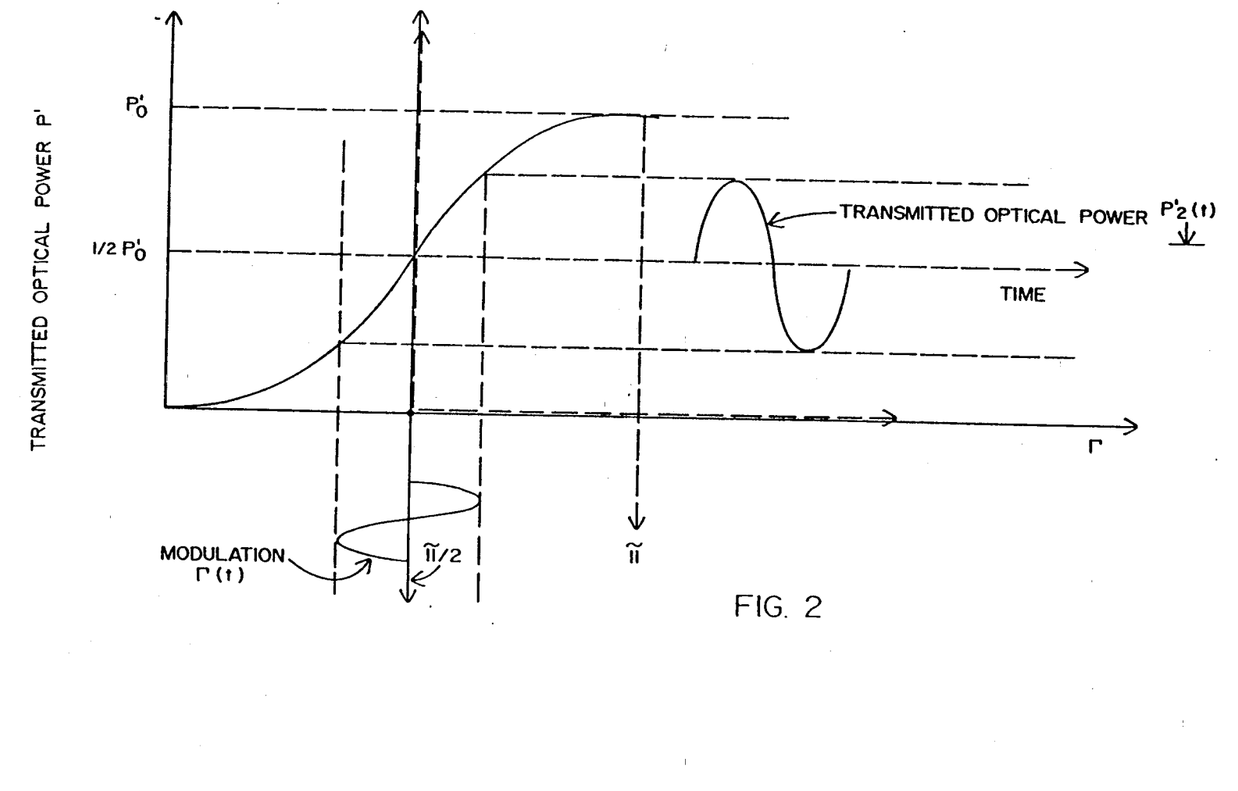
FIG. 2 is a graph of transmitted optical power versus phase retardation for the light passing through the phase retarder of FIG. 1.

By applying Jones calculus analysis to the system shown in FIG. 1, it can be shown that for an ideal system free from loss, the transmitted optical power is given by $$P_1' = \frac{1}{2} P_0'(1 - \sin[\Gamma(t)])$$

$$P_2' = \frac{1}{2} P_0'(1 + \sin[\Gamma(t)])$$

where $\Gamma(t) = kE(t)$, $P_1$, $P_2$ are the transmitted optical power in channel 1 and 2, $P_0'$ is the transmitted optical power after the light wave has passed the polarizer (see FIG. 2). If the incident light beam is completely unpolarized, $P_0'$ will be exactly half of the power of the incident light wave. $\Gamma(t)$ is the electrooptically induced phase retardation as function of time. E(t) is the electric modulation field as function of time, and k is a constant.

Consider the signal $$P_2' = \frac{1}{2} P_0'(1 + \sin[\Gamma(t)])$$

The signal can be separated into a DC part and an AC part:

$$P_{ac}' = \frac{1}{2} P_0' \sin[\Gamma(t)]$$

$$P_{dc}' = \frac{1}{2} P_0'$$

The ratio of the AC part to the DC part determines the voltage, and is independent of the optical power P. This ratio is referred to as the modulation depth m:

$$m = \frac{P_{ac}'}{P_{dc}'} = \sin[\Gamma(t)] = \sin[kE(t)]$$

For sensor applications a very small modulation depth is typically used, so the approximation sin x = x is valid.

In this case, it can be approximated that $$m = \frac{P_{ac}'}{P_{dc}'} = \Gamma(t) = kE(t)$$

When k is known, E(t) can be derived from $\Gamma(t)$. If only one channel is available E(t) can be determined from the modulation depth. If both channels are available, E(t) can be derived from the difference/sum relation $$\frac{P_2' - P_1'}{P_2' + P_1'} = \Gamma(t) = kE(t)$$

With two channels, both the DC and the AC signals can be treated. For a real device, the optical power $P^0$ injected into the system from the optical source is more appropriate than the entity $P_0'$. In an ideal system with no loss, and assuming a totally unpolarized wave entering the polarizer, the relation between $P_0'$ and $P_0$ is determined by a 50% polarization loss, yielding $$P_0' = \frac{1}{2} P_0$$

In a real system, loss will be present. Assume that the loss in the two channels are given by the attenuation coefficients a and b. The attenuation coefficients represent loss in the transmitter and detector fibers, coupling loss, reflection loss and also the 50% polarization loss that occurs, when the unpolarized wave passes through the polarizer. As a consequence, it is given that a, b<0.5.

For a real system, the detected optical power in the two channels is given by $$P_1 = \frac{1}{2} aP_0(1 - \sin[\Gamma(t)])$$

$$P_2 = \frac{1}{2} bP_0 (1 + \sin[\Gamma(t)])$$

For each signal an AC component and a DC component can be defined. For the signal $P_2$, the components are:

$$P_{ac} = \frac{1}{2} bP_0 \sin[\Gamma(t)]$$

$$P_{dc} = \frac{1}{2} bP_0$$

It can be seen that the relation $$m = \frac{P_{ac}}{P_{dc}} = \sin[\Gamma(t)] = \sin[kE(t)]$$

is valid for both channels, as m is independent of injected optical power $P_0$ and attenuation coefficients a, b. The difference/sum relation is only valid if a and b are identical, which is generally not the case. However, it is possible electronically to compensate for this by providing different amplification for the two channels in such a way that their resulting DC components are equal.

The electrooptic sensor is, from an optical point of view, an electrooptic amplitude modulator. Electrooptic amplitude modulators are generally grouped into two categories: Transverse modulators where the electric modulation field and the direction of propagation of the optical wave are perpendicular; and longitudinal modulators where they coincide. In addition, a diagonal modulator will be described, for which the electric modulation field is applied at 45 degrees relative to the direction of propagation of the light wave.

E-FIELD INTEGRATING SENSORS

The volta $V_{AB}$ between two points A and B is defined as the line integral of the electric field E $$V = E \int_0^P dl$$

where dl is the infinitesimal path length along an arbitrarily chosen path. A sensor which would be able to perform this line integral would provide an absolute measurement independent of local field inhomogeneities. The longitudinal and the diagonal electrooptic modulator would be able to perform this line integral, assuming that the electrooptic material is sandwiched between two electrodes, one at ground potential, and one at high voltage potential, and the light beam is allowed to traverse a path from one electrode to the other.

The transverse modulator does not perform the integral. However, for applications where the spacing between the two electrodes is not very large, the relative geometry of the electrooptic material and electrodes is fixed and the electrooptic material is in direct contact with the electrodes, the difference between the transverse and the longitudinal modulator is more academic than a matter of the accuracy of the device.

CASE A

Direction of Modulation Field Parallel to Poling Axis

In this case, the electric modulation field is represented by $E=(0, 0, E_z)$ and the index ellipsoid is represented by $$\left(\frac{1}{n_0^2} + r_{13}E_z\right)x^2 + \left(\frac{1}{n_0^2} + r_{13}E_z\right)y^2 + \left(\frac{1}{n_0^2} + r_{33}E_z\right)z^2 = 1$$

where $r_{13}$ and $r_{33}$ are the electrooptic coefficients and $n_0$ is the principal index of refraction.

The principal axes remain the same, and the indices of refraction are given by $$n_x = \left(\frac{1}{n_0^2} + r_{13}E_z\right)^{-\frac{1}{2}} \approx n_0 - \frac{1}{2} n_0^3 r_{13}E_z$$

$$n_y = \left(\frac{1}{n_0^2} + r_{13}E_z\right)^{-\frac{1}{2}} \approx n_0 - \frac{1}{2} n_0^3 r_{13}E_z$$

$$n_z = \left(\frac{1}{n_0^2} + r_{33}E_z\right)^{-\frac{1}{2}} \approx n_0 - \frac{1}{2} n_0^3 r_{33}E_x$$

The electrically induced phase retardation will depend on the direction of propagation of the optical wave through the material.

Transverse Modulation

Because of the rotational symmetry of the index ellipsoid around the z axis, the phase retardation in the transverse case will be independent of the orientation in the x and y directions. Consequently, if we calculate one solution, we will have them all.

The y axis is selected as the axis of propagation of the light wave. The analyzer is placed at an angle of 45 degrees relative to the z axis. The phase retardation is then given by $$\Gamma = \frac{2\pi |n_x - n_z| L_y}{\lambda} \simeq \frac{\pi n_0^3 (r_{33} - r_{13}) E_z L_y}{\lambda}$$

where $\lambda$ is the wavelength and $L_y$ the dimension of the sample of material in the y direction.

When introducing the voltage V across the sample and the dimension L of the sample in the z direction, the phase retardation is given by $$\Gamma \simeq \frac{\pi n_0^3 (r_{33} - r_{13}) V}{\lambda} \cdot \frac{L_y}{L_z}$$

Figure 3:
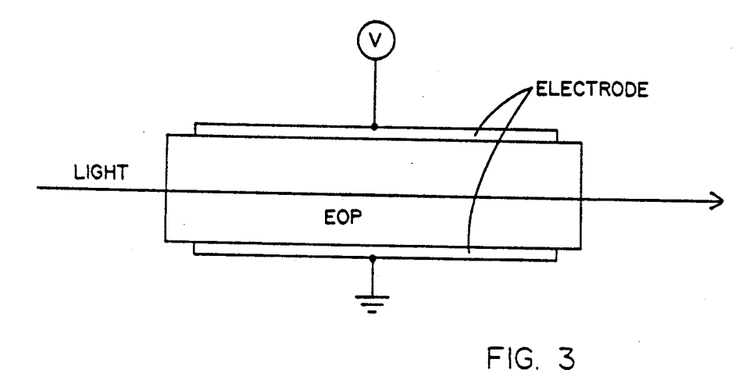
FIG. 3 is a simplified illustration of a transverse modulator.

This configuration has been used in most of the experiments with the electrooptic polymer, and is the configuration used in the high voltage sensor. The implementation of this particular configuration is especially simple because the same electrodes can be used for application of the poling field and the modulation field. FIG. 3 depicts a transverse modulator configuration.

CASE B

Direction of Modulation Field Perpendicular to Poling Axis

Transverse Modulation

The y axis is chosen as the axis of propagation of the optical light wave. The analyzer is placed with the direction of polarization parallel to the z axis. The induced phase retardation is then, using the same terminology as in case A, given by $$\Gamma = \frac{2\pi |n_z' - n_x'| L_y}{\lambda} \simeq \frac{2\pi n_0^3 r_{13} V}{\lambda} \cdot \frac{L_y}{L_x}$$

where $L_x$ is the dimension of the sample in the x direction.

CASE C

Modulation Field Diagonal to Poling Axis

By using x' or z' as the axis of propagation of the light wave, diagonal modulation can be obtained. It is diagonal because the electric modulation field is parallel to the x axis which is oriented at an angle of 45 degrees to x' and z'.

By selecting z' as the axis of propagation, one obtains the electrooptically induced phase retardation $$\Gamma = \frac{2\pi |n_x' - n_y'| L_{x'}}{\lambda} = \frac{\pi n_0^3 r_{13} V}{\lambda} \cdot \frac{L_{x'}}{L_x}$$

If x' is selected the result is the same except for the sign.

It can be demonstrated that longitudinal amplitude modulation is not possible with either the modulation field perpendicular, or parallel to the poling axis. However, the case where the modulation field is applied at a skew angle relative to the poling axis has not been studied. As a result of symmetry around the poling axis, this problem can be reduced to the situation where $E_z$ and one of the two other field components $E_x$, $E_y$ are nonzero. If the modulation field $E=(E_x, 0, E_z)$ is chosen, the equation for the index ellipsoid reduces to $$\left(\frac{1}{n_0^2} + r_{13}E_z\right)x^2 + \left(\frac{1}{n_0^2} + r_{13}E_z\right)y^2 +$$

$$\left(\frac{1}{n_0^2} + r_{33}E_z\right)z^2 + 2r_{13}zxE_x = 1$$

The electrooptic coefficients can be measured by electrooptic means that shall now be discussed. When a sample of electrooptic material is tested, the transmitted optical power is measured. When the hardware is optimized for maximum modulation, the transmitted optical power is given by one of the following two equations $$P_1' = \frac{1}{2} aP_0(1 - \sin[\Gamma(t)])$$

$$P_2' = \frac{1}{2} bP_0(1 + \sin[\Gamma(t)])$$

where a and b are attenuation coefficients.

The sign depends on the adjustment of the ¼ wave plate, the polarizer and the analyzer. Assuming the electrical modulation field is an ac field, the electrooptically induced retardation $\Gamma(t)$ can in both cases be determined by measuring the modulation index $$m = \frac{P_{ac}(t)}{P_{dc}} = \Gamma(t)$$

as the attenuation coefficients will cancel.

When the expression for $\Gamma(t)$, the modulation index m, the voltage V across the sample, length l of the sample in the propagation direction of the optical wave and the width d of the sample in the direction of the applied modulation field are known, the electrooptic coefficients can be calculated.

METHOD OF FABRICATION

Described simply, the fabrication process involves mixing the two components of an optical epoxy with electrooptic dye, and letting it cure while it is exposed to a high electric field.

In order to synthesize electrooptic polymer, one needs two basic components:

1. An electrooptic dye with a high electric dipole moment $\mu$ and a high second order nonlinear polarizability $\beta$. The figure of merit for the dye is the product $\mu \cdot \beta$. The dye molecules are able to align in an electric field. This field will, in the following, be referred to as the poling field.
2. A polymer, in the monomers of which the dye is soluble. The polymer must have the ability to undergo a transition from a state of high internal molecular mobility to a state of almost negligible mobility with the poling field applied. In the following, these two states will be referred to as the mobile state and the immobile state.

The electrooptic dye is only able to exhibit an electrooptic effect when the dye molecules have a finite degree of alignment. In order to align the molecules in an electric field, a high dipole moment is necessary. In the following, the combination of dye and monomer or polymer will be referred to as a dye/polymer system, independent of the state of cure.

In the presently preferred embodiment, the red AZO dye Disperse Red 1 (DR1) was selected. The dye has the chemical name 4-(4'-nitrophenylazo) N-ethyl, N-2-hydroxyethylaniline. This selection was based on a number of criteria: Since DR1 has a relatively high product of $\mu\beta$, it is suitable as a dye for use in electrooptical devices. DR1 is soluble in the monomers of the selected polymer up to 5% (weight). This figure is higher than for the other dyes tested.

The DR1/epoxy system in the above concentration is fairly transparent in the near infrared. This is important, because a sensor based on DR1 could be driven by an 820-nm source, which is available in both LEDs and semiconductor lasers. Unfortunately, DR1 is heavily absorbing in the visible spectrum. This makes it impossible to operate a sensor with a He-Ne laser at 633 nm or a visible red LED at 650 nm. in spite of the fact that a 650-nm LED would require much less expensive polarization and optoelectronic devices. The use of other dye molecules with shorter wavelength absorption bands would make it feasible to operate the sensor in the visible red region of the spectrum.

DR1 is commercially available. Though it does not typically come in a ready-to-use form, little work is required to purify it. DR1 is a very well documented dye. Several researchers have succeeded in poling thin films of DR1 in polymers. Its properties are fairly well known, an advantage when attempting to fabricate samples in bulk form, which appears not to have been done prior to the present invention.

As part of the experimental work related to the present invention, other dyes which were believed to have comparable $\mu\beta$ products were tested. All were discarded, either because of poor solubility in epoxy, or because they reacted with the epoxy during the curing process, changing the properties. It is most likely though, that the future will bring new dyes with even better properties than DR1. However, these dyes will probably not be commercially available, but will have to be synthesized in the laboratory.

DR1 is, as mentioned earlier, commercially available, but not in its pure state. As the dye comes from the manufacturer, it is a powder mixed with some inert material. In order to purify DR1, one has to extract it from the commercial product which can be done using acetone as a solvent. When the insoluble fraction has been filtered off, one is left with pure DR1 in acetone. The acetone can easily be evaporated by applying heat, leaving the pure DR1 in dry form. The dye crystallizes in this process and should be ground into fine particles in order to facilitate solubility in the epoxy.

Polymerization means that shorter molecules (monomers) are bonded together chemically and incorporated into longer chain molecules (polymers). Polymers are often solid materials. When this process takes place, the material gradually undergoes a transition from a liquid state to a typically solid state. The internal mobility in the solid state is a function of the nature of the polymer and the temperature. Some polymers are cross-linked, meaning that chemical bonds occur between the individual chains of molecules. These materials are generally much more stable. Epoxies are examples of cross-linked polymers.

The condensation polymerization process is often referred to as a curing process. As polymerization takes place, the system undergoes a gradual change in which more and more chemical bonds are formed. This process can take place in minutes, hours or days. The state of incomplete cure is referred to as partly cured. The time it takes from the initiation of polymerization until the cured state has been reached is referred to as the curing time. The curing time can often be significantly decreased by applying heat. When the sample has fully polymerized, it is referred to as completely cured.

All polymers have a glass transition temperature $T_g$, at which point the material goes from a glassy state to a rubbery state. Though from a cursory point of view a partly cured sample might look identical to a fully cured sample, the internal mobility can be much higher. It is necessary to raise the temperature to $T_g$ or above in the poling process and let the sample cool with the poling field maintained in order to obtain adequate alignment. Above $T_g$, mobility will be drastically increased, leading to accelerated decay of the alignment of dye molecules, and the electrooptic effect in the case of an electrooptic polymer.

Therefore, for sensor applications, operation below $T_g$ is necessary, and this is why a polymer with high $T_g$ is desirable. Polymers with high $T_g$ normally have less mobility below that temperature than those with low $T_g$. Thus a higher $T_g$ material will be more mechanically stable at lower temperatures. One can ascribe a $T_g$ also to a polymer in its partly cured state. Here $T_g$ is a function of the degree of cure, with increasing values of $T_g$, the closer the state is to the fully cured state. A general rule is that the higher the degree of cross-linking is a polymer, the higher $T_g$. Epoxies are examples of polymer with high $T_g$.

An electrooptic dye can be incorporated into a polymer in these three ways:
1) With the dye dissolved in the polymer as a guest/host system;
2) With the dye covalently attached to the polymer as a pendant group; or
3) With the dye covalently incorporated into the backbone or network structure of the polymer.

GUEST/HOST SYSTEM

The dye is dissolved in the monomers of the material. When polymerization takes place, a web of chain molecules is formed, in the vacancies of which the dye molecules are trapped and immobilized. During the curing as the web is growing, the vacancies grow smaller and smaller, until the dye molecules are so well confined, that they are not able to rotate.

PENDANT DYE-POLYMER SYSTEMS

The dye molecules themselves are attached to the monomers. When polymerization takes place, the dye molecules will be attached to the web of polymerized chain molecules. This is often referred to as the dye being attached to the backbone of the polymer. Another method to produce the pendant dye-polymer materials is to synthesize a polymer which has a pendant functional group to which a dye can be attached after polymerization. As the dye molecules are not just confined to the vacancies, but are actually tied to the backbone, this is a more stable system.

BACKBONE DYE-POLYMER SYSTEM

The dye molecules themselves are polymerizable at two or more sites on the molecule. As polymerization takes place, the dye molecules will be incorporated into the web of polymerized chain molecules, as part of the backbone. This configuration is more stable or as stable as the copolymer configuration.

For sensor applications, a long lifetime is important. Therefore, a very stable polymer is necessary. This indicates the need for a material with high degree of cross-linking and high $T_g$. These demands eliminated using PMMA (polymethlymethacrylate, commonly known as Plexiglas in the United States and Perspex in England) so an optical-grade epoxy was selected instead. The Epoxy used is cross-linking and has a relatively high $T_g$. The simplest approach was to buy a commercially available epoxy and dissolve in the dye. This approach provided only for a guest/host system, but was chosen for simplicity.

Making a cross-linked epoxy type polymer with DR1 attached to the backbone is theoretically possible, but requires some synthesis in the laboratory. A guest/host system based on DR1/epoxy was selected, and this system is the basis of the described embodiment. The properties of the epoxy however, will also affect results. The epoxy needs to be transparent at the sensor wavelength. Furthermore, it would be convenient if its index of refraction would be close to that of glass, which is the substrate material for the selected polarizers and the waveplate.

The dielectric strength of the electrooptic polymer is important, as it sets a limit to the strength of the poling field and the voltage measurement range. Also the volume resistivity and the dielectric constant are important. A low volume resistivity could be prohibitive for high voltage applications, as an excessively large current running through the material could cause thermal meltdown. A high dielectric constant could make it difficult to interface the material with electrodes, as even a small air gap would have a voltage drop comparable to that across the electrooptic material. This could lead to insufficient poling and erroneous sensor response.

For simplicity, the combination of dye and polymers will be referred to as the dye/polymer system independent of the state of cure and independent of whether the reference is made to a guest/host system or to a pendant dye polymer or backbone dye-polymer system. In order to perform the poling process and maintain the electrooptic effect, it is necessary to be able to generate two states in the dye/polymer system, one where the degree of mobility of the dye molecules is high, and one where it is negligible. There are different approaches to this problem depending on the type of polymer being used.

Figure 4:
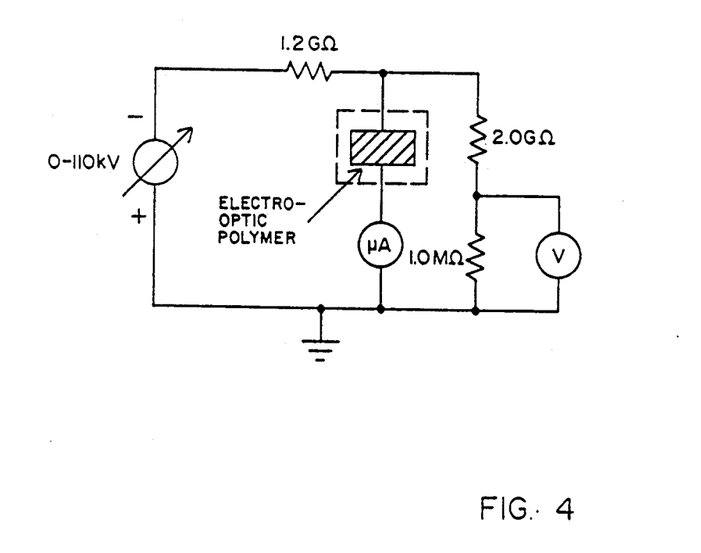
FIG. 4 is a schematic drawing of a circuit used for poling the electrooptic polymer of the present invention.

The principle of the poling process is to expose the dye/polymer system in a mobile state to an electric field in order to make the dye molecules line up in the direction of the field. The electric field is referred to as the poling field, and the alignment of the dye molecules is referred to as poling. In order to maintain poling, the dye/polymer system has to undergo the transition from a state of high mobility of the dye molecules to a state of negligible mobility with the poling field maintained. A schematic of the poling arrangement is given in FIG. 4.

In thermo-poling the temperature of the fully cured dye/polymer system is raised to above $T_g$, the poling field is applied and the system is cooled to below $T_g$ with the poling field maintained. This method has been successfully used to fabricate electrooptic thin films based on the system dye/PMMA, using guest/host systems as well as copolymer systems. The copolymer systems have been the most stable, but unfortunately PMMA is non cross-linking and has low $T_g$, which gives it a lifetime too short to be acceptable for sensor applications.

Cure-poling refers to a process in which the poling field is applied to the dye/polymer system that is in a partly cured state, and the field is maintained until the cured state has been reached. This was the first method that was attempted for poling, but with no positive result. The sample was pre-cured for 17 hours at room-temperature before any attempt was made to turn the poling field on. As epoxy is ionic conductive in the early and partly cured states, the electric field was increased very slowly in order not to damage the sample.

This process starts with the dye/polymer system in a pre-cured state. The poling field is gradually turned on, and at the same time heat is applied. The current through the sample, which is a control parameter for the process, is monitored, and the poling field is regularly adjusted, using this information. When the temperature reaches a certain predetermined value above $T_g$ of the fully cured epoxy, it is held constant. The current is a good indicator of the state of cure. When the current begins to drop appreciably, this indicates that the sample is approaching cure, and it is left for an additional period of time to be absolutely sure that it has been 100% cured. When this time has passed, the sample is left to cool to room temperature while maintaining the poling field. When room temperature has been reached, the poling field is turned off and the poling has been completed. This proved to be a successful method.

In order to perform a poling, one must be able to place the dye/polymer system between a pair of electrodes which, with a suitable voltage applied, can provide for the poling field. Some kind of containment is necessary to keep the liquid dye/polymer system in place between the electrodes. This is provided for by the mold. The mold has to be made out of a dielectric able to withstand the same high electric fields as the dye/polymer system.

Figure 5:
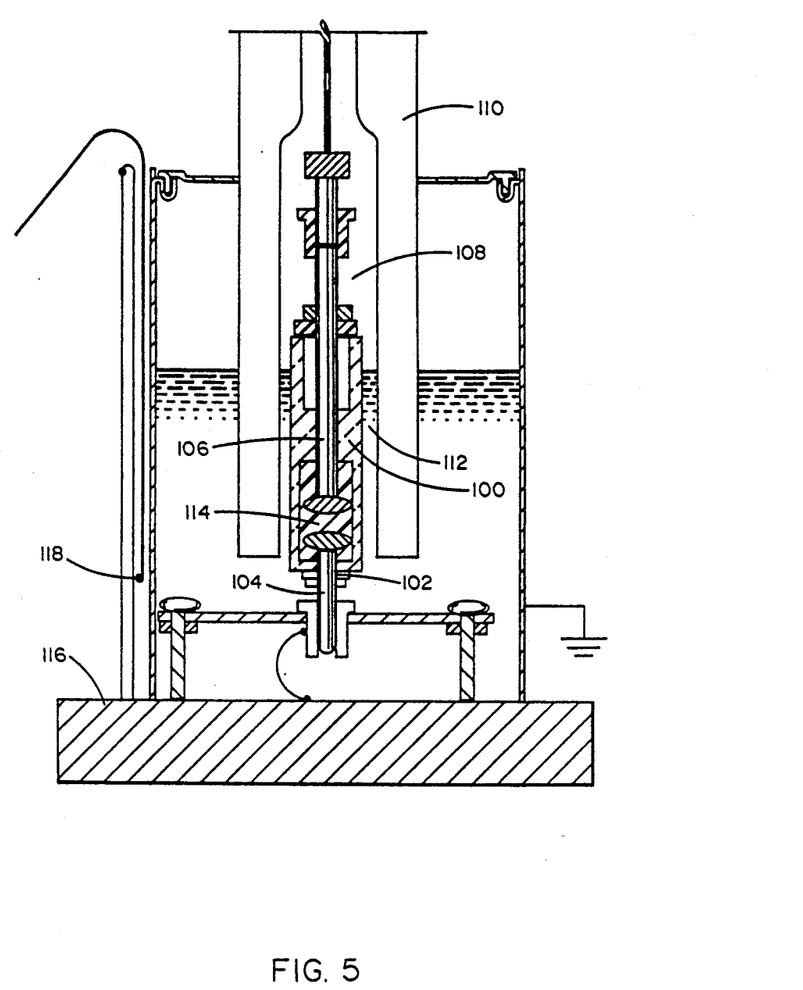
FIG. 5 illustrates apparatus used in the fabrication process of the invention.

The mold is depicted in FIG. 5. It was made out of a glass spectrophotometric cuvette 100. A hole 102 was drilled in the bottom, and the ground potential electrode 104 was mounted there. The high voltage electrode 106 was mounted to reach into the cuvette 100 from the top. This type of mold was used with the same poling arrangement as previously described. Due to rounded electrodes it was possible to use a much higher poling field, and consequently a significantly higher electrooptic effect was obtained. Because of the glass walls, no grinding or polishing was needed. The poling apparatus included a chamber 108 formed inside a Teflon tube 100 and partially filled with an oil 112 providing electrical insulation and homogeneous heat transfer to the sample 114 provided by a hot plate 116 and monitored by a temperature probe 118. The sample could be taken directly from the poling apparatus and placed in the optical test set up.

Figure 6:
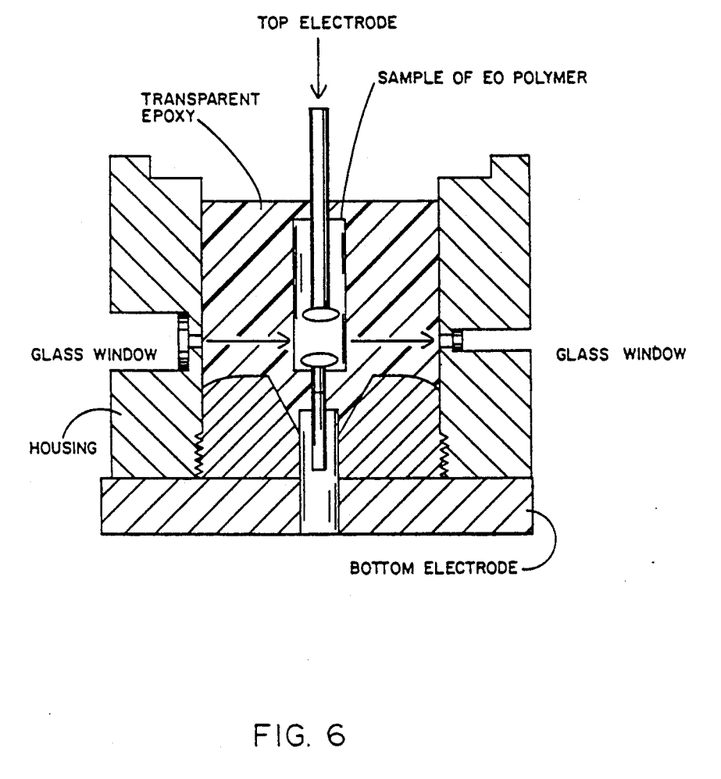
FIG. 6 illustrates the sensor of the present invention showing the sensor housing and a sample of electrooptic polymer therein.

Some cracks had formed in the glass. These were not a problem during the poling, as they were filled with oil. However they set a limit to the modulation field in the test set up. In order to avoid this problem, a polystyrene cuvette was used for the later samples. This final version is shown in FIG. 6. The polystyrene becomes soft and pliant at 80 degrees C., eliminating the problem of crack formation. In order to protect the polystyrene from attack from the hot oil, it is necessary to cover the outer walls of the cuvette with a thin layer of regular "5-minute" epoxy. This, of course, ruins the optical surface quality of the cuvette. However, it is possible to break and remove the polystyrene cuvetted without damaging the epoxy sample. As the inner surfaces of the cuvette are very smooth, the optical surface quality of the sample, when the cuvette has been removed, is sufficient to obviate polishing.

The electrooptic polymer developed is based on a transparent epoxy as the host polymer, mixed with the electrooptic AZO dye Disperse Red 1 (DR1), systematically known as 4-(4-nitrophenylazo) N-ethyl, N-2-hydroxyethylaniline. As host polymer, the optically transparent epoxy EPO-TEK 301-2 from Epoxy Technology Inc., was selected. DR1 is soluble in the monomers of the epoxy at concentrations up to 5% (by weight) above which saturation takes place.

DR1 is purified by extraction with acetone. The acetone is evaporated, and the pure dye, which forms crystals, is ground into a fine powder. The red powder is mixed with the epoxy in its monomer state to 5% concentration. In order to dissolve all the dye, heating and stirring for a long time is necessary. Stirring with a magnetic spin bar for days has given the best results. When all the dye is dissolved, the amine is mixed in and the cure of the epoxy is initiated. It is important to mix until there is no sign of phase separation between the epoxy and the amine. After this has been accomplished, the compound is brought into a vacuum chamber and vacuum is applied until it is evident that most air bubbles have left the sample.

The epoxy compound is now poured into a mold, with both a bottom and top electrode in direct contact with the epoxy. The mold is placed in a vacuum chamber in order to remove all air bubbles. The sample is left in the vacuum chamber to partly cure for 15–20 hours in vacuum.

The next step is to place the mold in an oil bath, with the electrodes connected to a 100 kV (dc) high voltage supply. The oil bath works as a medium for heat transfer and electrical insulation. When the heat is turned on, the increased temperature accelerates the curing process. When the sample has reached about 40 degrees C., the poling process can begin. The poling process is the alignment of the dye molecules in the electric poling field. The alignment of the dye molecules provide for the electrooptic effect in the fully cured polymer.

Voltage is gradually applied across the sample as it is being heated. The current through the sample is constantly monitored and the voltage is adjusted so that the current does not exceed a preset limit of 10 $\mu$A through the sample with a 1 cm$^2$ cross section. When the temperature in the oil bath reaches 80 degrees C., it is kept stable. At 80 degrees C., the cure time is only 1.5 hours.

As the state of cure proceeds, the current gradually drops as a function of the decrease in ionic conductivity. The voltage can therefore be frequently increased to keep the preset current value. This procedure is repeated several times until the maximum electric poling field of approximately 180 kV/cm has been reached. Simultaneously the current decreases to its minimum of a few $\mu$A or less.

The decreased current indicates that the sample is close to having reached its fully cured state. The temperature and voltage are maintained for a period of time, to make sure that the sample is 100% cured. Including the pre-cure time, and the long time it takes to heat up the sample to 80 degrees C., at least 45 minutes to 1 hour should be allowed. Then the heat is turned off and the system is cooled down to room temperature, still with the poling field applied. When room temperature has been reached, the poling process is completed and the mold can be removed from the oil bath. Once a sample has been fabricated, the next step is to test whether its electrooptic properties are satisfactory. This is done on an optical bench.

If the sample has been cast in a glass cuvette, it can be taken directly from the oil bath, cleaned and mounted in the optical test system. If the sample has been cast in a polystyrene cuvette, it is necessary to first remove the polystyrene walls. With care, this can be done without any damage to the optical surfaces of the sample. If damage is done, the optical surfaces will have to be polished.

The test system is, from an optical functional point of view, identical to the fiber optic sensor system, the Pockels cell, of which the electrooptic polymer is going to be an integrated part. The sensor system is much like a transversely modulated electrooptic laser modulator. However, instead of using fiber optics, discrete optical components on an optical bench are utilized. This system allows greater flexibility. It is much easier to mount the sample and there are more degrees of freedom in adjusting the polarizing components.

The test system, works as follows: The light source is a horizontally linearly polarized infrared He-Ne laser (1150 nm. 0.7 mW). In order to give maximum sensitivity and linearity to the system, an offset phase retardation of $\frac{1}{4}$ wave, which changes the polarization state of the light from linear to circular, is provided. This is normally done with a $\frac{1}{4}$ wave plate mounted with its fast axis at an angle of 45 degrees relative to the polarization plane of the incoming light. However, $\frac{1}{4}$ wave plates for 1150 nm. are not standard components. Therefore, a Babinet-Soleil compensator was mounted with its fast axis at the same angle as mentioned for the $\frac{1}{4}$ wave plate. The Babinet-Soleil compensator is a variable retarder (waveplate) and it is adjusted to give an offset phase retardation of $\frac{1}{4}$ wave. The Babinet-Soleil compensator can be adjusted, unlike a $\frac{1}{4}$ wave plate, to compensate for intrinsic retardation (birefringence) in the sample. After having passed the Babinet-Soleil compensator, the beam passes through the sample of electrooptic polymer. The electrooptic polymer, like the $\frac{1}{4}$ wave plate, works as a phase retarder. The phase retardation originating from the electrooptic polymer consists of two components. One component is the intrinsic retardation (birefringence), which can be compensated for by the Babinet-Soleil compensator.

The other component is the phase retardation induced by the voltage across the sample due to the electrooptic effect. This is the component to be measured. As this component is proportional to the voltage across the sample, it is in this case a 60-Hz waveform with an amplitude proportional to the amplitude of the voltage.

The sum of the three contributions of phase retardation, two coming from the electrooptic polymer, and one from the Babinet-Soleil compensator, result in a net polarization state of the light once it has passed these two optical components.

The two time-invariant components together result in the $\frac{1}{4}$ wave phase shift. This phase shift brings the light from the linear polarization state to a circular polarization state. The time varying signal (60 Hz), modulates the radius of the circle, at an angle of 45 degrees relative to both the fast axis and the slow axis of the electrooptic polymer. In this way, the circle is modulated between two elliptical states.

No detector is able to analyze the phase of the light directly, so the polarization modulation has to be converted to a modulation in optical power. This is done by an analyzer. The analyzer is a linear polarizer. It is mounted with its polarization axis at an angle of 45 degrees relative to both the fast axis and the slow axis of the electrooptic polymer. This yields four different solutions. In two of those, the resulting modulation in optical power will be in phase with the original electrical modulation signal. In the two others, it will be in anti-phase.

The transmitted optical power as function of time consists of a relatively large DC part, with an AC ripple on top. The AC ripple is a duplicate of the electrical modulation signal. Though the DC part of the signal does not contain information about the electrical modulation, it is still important because it can serve as a reference. The ratio of the AC part relative to the DC part is a measure for the electrical modulation signal, as it is independent of the injected optical power and the loss in the system.

The transmitted optical power is incident on a germanium photo diode and measured by an optical power meter. The electrodes mounted on the sample of electrooptic polymer are connected to a high voltage power supply and the sample is modulated with a 7.96-kV, 60-Hz sinusoidal voltage. The DC level of the optical signal is measured by the power meter and the AC modulation originating from the electrooptic modulation is monitored on an oscilloscope. Its RMS value is measured with a lock-in amplifier synchronized with the voltage supply.

The optical power output from the laser was 1.32 mW and the power transmitted was 263 $\mu$W. At a modulation voltage of 7.96 kV, the modulation index (the ratio of the RMS value of the AC signal relative to the DC level of the transmitted power) was measured. The value was $4.2 \times 10^{-3}$. The electrooptic coefficients for the polymer can be calculated from this result. The values are $r_{33} = 2.2 \times 10^{-14}$ and $r_{13} \frac{1}{3} r_{33}$.

The value of the electrooptic coefficient is much smaller than for electrooptic crystals. However, for utilizing the electrooptic polymer in a high voltage sensor, the plan is to have the voltage, which is on the order of 10–20 kV, directly applied across the material. This results in an electric field large enough to provide an easily detectable signal, even for this small value of electrooptic effect. To improve the signal-to-noise ratio, one may increase the electrooptic effect by a factor of 10–50. This value is within the range of what is suitable for a high voltage sensor. A much higher electrooptic effect would lead to inaccuracy due to a non-linear response of the sensor.

The purpose of developing a poling process for fabrication of electrooptic polymer was to demonstrate that this material can be used for voltage measurement at high voltage levels. To demonstrate this, a fiber optic AC voltage measuring system has been built. The system has only been built for demonstration purpose, and development work remains to be done to create a device appropriate for industrial mass production.

In order to make the design process as simple as possible, it was decided to build the fiber optic sensor to reflect the laboratory set up on the optical bench as closely as possible. It was therefore decided to use the same polarimetric configuration as described above.

Figure 7:
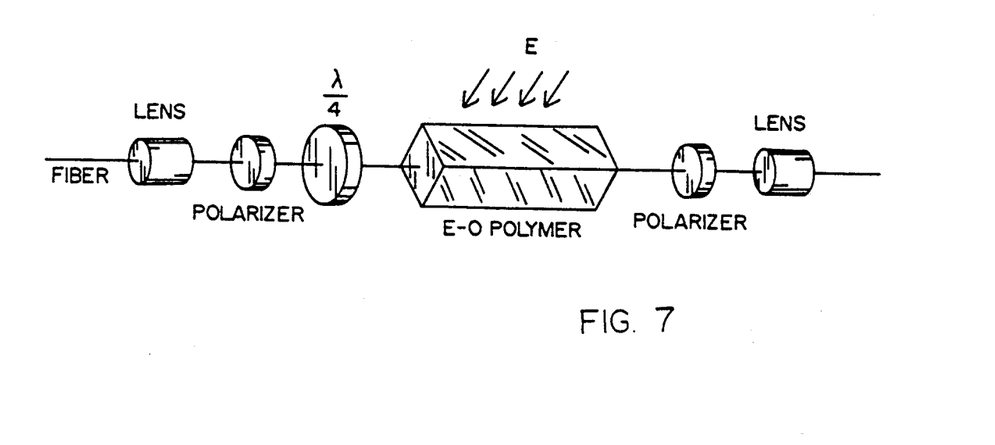
FIG. 7 is a schematic representation of a fiber optic transmission system in which the invention may be applied.

The light is sent through the polarizer, the $\frac{1}{4}$ wave plate, the electrooptic polymer sample, and the analyzer in a straight beam, exactly as it was done on the optical bench. One difference between the transmission principle in the fiber optic sensor and that of the optical bench is that in the fiber optic sensor, the straight beam is provided by collimating the beam from an optical fiber with a GRIN rod lens (GRaded INdex rod lens) instead of using the straight laser beam. When the beam has passed the analyzer, it is focused by another GRIN rod lens into the core of an optical fiber. The optical fiber transmits the optical signal from the detector. In the same way, the optical power is brought from the light source, which is an 820 nm LED, to the sensor. The optical polarization components are, in principle, just miniature versions of the same type of components used on the optical bench. The principle of the fiber optic transmission system can be seen in FIG. 7.

In order to position the optical polarization components at the correct relative angles, some means of rotational adjustment is necessary. To provide this, the optical sensor was fabricated in four parts, which can be rotated independently.

The electrooptic polymer with electrodes constitute one part. This part is potted into the sensor housing, which provides for electrical insulation and mounting for the other rotating part. This electrooptic polymer/housing configuration is illustrated in FIG. 6.

The $\frac{1}{4}$ wave plate is cemented to the end of a short pipe which is able to rotate inside a hole in the sensor housing. Each of the two polarizers are mounted in the same way, cemented to the end of a hollow cylinder, which also contains a GRIN rod lens. The polarizer and the GRIN rod lens are cemented together with optically transparent epoxy. The other end of the cylinder has been made to mount to a fiber optic SMA connector. When the connector is mounted, the polarizer, the GRIN rod lens and the optical fiber constitute one part, from a mechanical perspective. In the following, the two parts will be denoted the polarizer and the analyzer, dependent on their function in the system.

The analyzer is mounted in a hole in the sensor housing where it can be rotated relative to the electrooptic polymer sample.

The polarizer is mounted inside the short pipe which holds the $\frac{1}{4}$ wave plate. In this way, the polarizer and the $\frac{1}{4}$ wave plate are able to rotate independently, relative to each other, and relative to the electrooptic polymer in the sensor housing.

In addition to the optical polarization components and the electrooptic polymer, the sensor consists of the sensor housing and a top and bottom electrode.

In the sensor head, the following components have been used:

Electrooptic polymer: 5% DR1 in EPO-TEK 301-2, electrode gap 3.0 mm, length 9.0 mm, poled at 54 kV.

$\frac{1}{4}$ wave plate: Meadowlark Optics (CO), Achromatic retarder, center wavelength 850 nm, diameter 0.5 in. The $\frac{1}{4}$ wave plate consists of several layers of birefringent polymer material, cemented between optical windows.

Polarizers: Corning, 8612 Polarcor 800 High Contrast, nominal wavelength 800 nm, diameter 6 mm. (Polarcor is a mixed alkali borosilicate glass containing submicroscopic silver particles aligned along a common axis. Resonant absorption by the silver conduction electrons provide preferential absorption of the polarization component aligned with the long axis of the silver particles.)

GRIN rod lenses: Nippon Sheet Glass Company (Japan), [Vendor: Melles Griot (CA)], SELFOC, Melles Griot product number 06 LGS 212, pitch 0.25, N.A. 0.37, diameter 2.0 mm.

Figure 8:
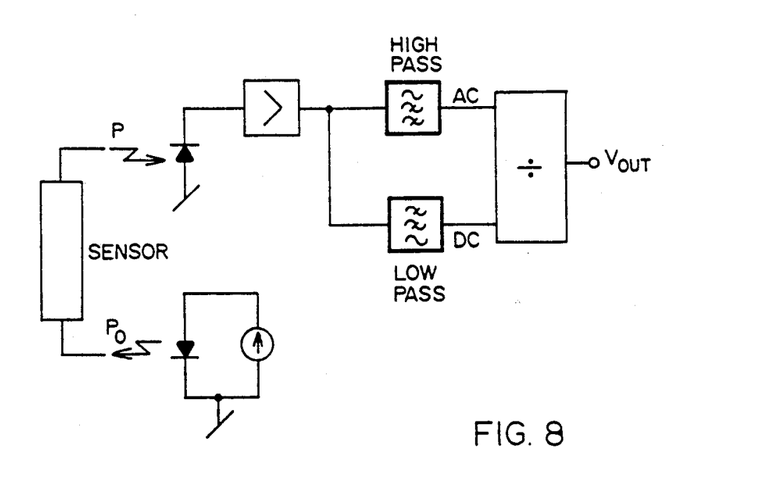
FIG. 8 is a schematic drawing of a circuit used in testing the present invention.

For transmission of optical power the following were used:

Transmitter fiber: Siecor, core 200 μm, N.A.;

Receiver fiber: 3M EOTec, TECS FT (400)LMT, core 400 μm, N.A. 0.37, max. attenuation at 850 nm is 6 dB/km.;

The light source and the detector are a Light Emitting Diode and a PIN photodiode;

LED: Hewlett Packard, HFBR 1404, center wavelength 820 nm.;

PIN diode: Hewlett Packard, HFBR 2208;

The signal detection circuit is shown in FIG. 8.

It has been demonstrated that it is possible to fabricate electrooptic polymer in bulk form and use it in a voltage sensor at high voltage levels. The material could be fabricated in sheets, sandwiched between electrodes made of a thin metal foil (in the same way dry wall is made of gypsum covered with paper). The thickness of the sheet of electrooptic polymer would depend on the voltage level at which the material was going to be used. Individual pieces of polymer for the sensors could easily be cut from such sheets.

In order to fabricate the electrooptic polymer in sheet form, a special poling apparatus should be developed. In the development phase the fabrication method could easily be tested with sheets of relatively small dimension. As vacuum is necessary to get the dissolved air out of the resins to avoid dielectric breakdown in the cured polymers, the poling apparatus should be set up in a vacuum oven. During the poling process, the oven should be heated up to the desired temperature. Flooding the oven with an electrically insulating gas, at a pressure slightly higher than atmospheric pressure, could prevent dielectric breakdown in air. The correct poling apparatus design, combined with the use of electrically insulating gases, would probably eliminate the need for an oil bath in the poling process. During the poling process, temperature, voltage and current through the material should be controlled. An algorithm to control these parameters could be devised to put the whole process under computer control.

Small pieces can easily be cut from a sheet of electrooptic polymer and mounted in a prefabricated sensor housing. The sensor housing can be made in such a way that the electrooptic polymer is automatically mounted in the correct position. The electrooptic polymer is then potted in a transparent polymer which is simply poured into the sensor housing. Because of the match in the index of refraction between the electrooptic polymer and the transparent polymer, only very little polishing of the optical surfaces is necessary. The optical polarization components could be mounted in the sensor housing and be potted into the transparent polymer in the same manner. Even the tips of the optical fibers could be embedded in the transparent polymer. Several types of polarizers and ¼ plates are currently on the market. The price and performance of the different types should be thoroughly studied, especially the temperature dependency of the components. As the electrooptic epoxy is intrinsically birefringent, it might even be possible to control the intrinsic birefringence, to provide for the ¼ wave of phase retardation.

When using the sensor for practical applications in electric power systems, one possibility would be to build the sensor into a hollow insulator and pot it into an insulating material. This concept has the disadvantage that one terminal on the sensor has to be directly wired to ground. An alternative possibility would be to place the sensor between the high voltage inner conductor and a conducting cylinder at a floating potential surrounding the inner conductor. This concept has the disadvantage that the potential of the surrounding cylinder is dependent on the ambient electric field. If the ambient electric field changes (as a truck goes by, or during rain) the output of the sensor will change. However, if the distance from the surrounding cylinder to what perturbs the ambient field is large compared to the distance between the inner conductor and the surrounding cylinder, the change in output will be small, and as a result of this, the sensor will still be fairly accurate.

The theoretical background for fabrication of electrooptic polymer in bulk form and the use of this material in a voltage sensor has been discussed. It has been demonstrated for the first time that it is possible to fabricate electrooptic polymer in bulk form. Though the electrooptic coefficients obtained have been rather small, they have been large enough to utilize the material in a fiber optic voltage sensor operating over a range from a few volts to 35,000 volts, with excellent linearity. As such, it has been proved that it is possible to fabricate electrooptic polymer in bulk form and use it in a fiber optic high voltage sensor. Over the duration of this work, no weakening of the electrooptic effect was observed. Future chemical development of the materials can be expected to lead to higher dielectric breakdown strength, higher sensitivity and increased stability. It is expected that the fabrication process described herein can be expanded to a larger scale production of electrooptic polymer. Electrooptic polymer could become the key material in future fiber optic voltage sensors.

Those having skill in the art to which the present invention pertains will now, as a result of the applicants' teaching herein, perceive various modifications and additions which may be made to the invention. By way of example, the precise steps as well as the sequence of such steps disclosed herein for carrying out an embodiment of the process of the present invention may be readily altered by changing materials, temperatures, timing and electrical characteristics while still preserving the essential features of the sensor produced thereby. Accordingly, it will be understood that all such modifications and additions are deemed to be within the scope of the present invention which is limited only by the claims appended hereto and equivalents thereof.

We claim:

1. A method of fabricating an electrooptic polymer high voltage sensor; the method comprising the steps of:
   a) preparing a fine powder form of purified electrooptic dye having a selected figure of merit;
   b) dissolving said dye in a transparent epoxy and initiating the cure of said mixture;
   c) pouring said mixture into a mold having first and second opposed electrodes in direct contact with said mixture;
   d) applying a poling field to said mixture across said electrodes, during the curing of said mixture, to align the dye molecules therein; and e) maintaining said poling field until said mixture is fully cured;

f) attaching wires to said electrodes for connecting said sensor to a power distribution system; and g) placing a housing containing optical components and connected to optical fibers around said cured and poled mixture.

2. The method recited in claim 1 further comprising the steps of monitoring the current through said mixture during steps d) and e) and adjusting said poling field to avoid exceeding a pre-selected limit of current therethrough.

3. The method recited in claim 1 further comprising the steps of placing said mixture in a substantial vacuum and heating said mixture before performing step d).

4. The method recited in claim 1 further comprising the step of placing said mixture in a chamber containing an electrically insulating fluid while performing steps d) and e).

5. The method recited in claim 1 wherein in step a) said dye comprises electrooptic AZO dye Disperse Red 1.

6. An electrooptic polymer high voltage sensor for use in a fiber optic system for measuring high voltage by utilizing phase retardation as a function of voltage across the sensor; the sensor comprising:

a bulk sample of electrooptic polymer formed by the following steps:

a) preparing a fine powder form of purified electrooptic dye having a selected figure of merit;

b) dissolving said dye in a transparent epoxy and initiating the cure of said mixture;

c) pouring said mixture into a mold having first and second opposed electrodes in direct contact with said mixture;

d) applying a poling field to said mixture across said electrodes, during the curing of said mixture, to align the dye molecules therein; and e) maintaining said poling field until said mixture is fully cured;

said sensor further comprising wires attached to said electrodes for applying said high voltage thereto and a housing substantially surrounding said bulk sample, said housing having transparent windows for connection to said fiber optic system.

7. The sensor recited in claim 6 wherein said dye is electrooptic AZO dye Disperse Red 1.

8. The sensor recited in claim 6 wherein the mold recited in step c) comprise said housing of said sensor.

9. The sensor recited in claim 6 wherein said housing receives said mold within which said bulk sample resides.

* * * * *